United States Patent [19]

Arakawa

[11] Patent Number: 5,388,078
[45] Date of Patent: Feb. 7, 1995

[54] SEMICONDUCTOR MEMORY DEVICE HAVING CURRENT TO VOLTAGE CONVERSION TYPE AMPLIFIER

[75] Inventor: Hideki Arakawa, Tokyo, Japan

[73] Assignee: Sony Corporation, Tokyo, Japan

[21] Appl. No.: 729,442

[22] Filed: Jul. 12, 1991

[30] Foreign Application Priority Data

Jul. 13, 1990 [JP] Japan .................................. 2-184039

[51] Int. Cl.[6] .............................................. G11C 7/00
[52] U.S. Cl. .................................. 365/203; 365/204; 365/205; 365/208; 365/189.09; 327/51; 327/103
[58] Field of Search ........... 365/203, 204, 205, 189.09, 365/208; 307/530

[56] References Cited

U.S. PATENT DOCUMENTS

| | | | |
|---|---|---|---|
| 4,785,424 | 11/1988 | Lin et al. | 365/204 |
| 5,031,145 | 7/1991 | Lever | 365/205 |
| 5,160,861 | 11/1992 | Lee | 307/530 |
| 5,161,123 | 11/1992 | Mochizuki | 365/204 |
| 5,175,705 | 12/1992 | Iwahashi | 365/203 |
| 5,187,392 | 2/1993 | Allen | 307/530 |

FOREIGN PATENT DOCUMENTS 0318927 6/1989 European Pat. Off. .
0335149 10/1989 European Pat. Off. .
0099473 3/1990 European Pat. Off. .

Primary Examiner—Timothy P. Callahan
Assistant Examiner—Trong Phan
Attorney, Agent, or Firm—Hill, Steadman & Simpson

[57] ABSTRACT

A semiconductor memory device of the present invention includes a sense amplifier for converting an electrical current flowing through a sense node between a load and a current limiting circuit into an electrical voltage and for outputting the produced electrical voltage. The sense amplifier is constituted by plural stage amplifiers each of which may be shorted across it input and output terminals. The amplifiers are set to the amplifying state, stage by stage, starting at the amplifier closest to the node, for overcoming problems concerned with noise superposition or an output delay caused by bit line overcharging. In a preferred embodiment, MOS transistors for electrical discharging or precharging are provided in the bit line or the sense node for speeding up the operation.

11 Claims, 8 Drawing Sheets

SEMICONDUCTOR MEMORY DEVICE HAVING CURRENT TO VOLTAGE CONVERSION TYPE AMPLIFIER

BACKGROUND OF THE INVENTION

1. Field of the Invention

This invention relates to a semiconductor memory device, such as an EPROM or a mask ROM, making use of a current-to-voltage conversion type sense amplifier.

2. Description of Related Art

A memory device, such as an EPROM or a mask ROM, usually has its memory cells constituted by MOS transistors. In each memory cell, data to be stored, such as "0" or "1" are determined as a function of the threshold voltage of the MOS transistor. The MOS transistor constituting the memory cell has its drain and source connected to a bit line and a grounding line, respectively. The data stored in the memory cell are read out as the magnitude of the electric current flowing in the bit line.

FIG. 1 is a circuit diagram showing a sense amplifier and related circuitry of a conventional EPROM. A power supply voltage Vcc is supplied to a sense node 1 by means of a pMOS transistor 7 as a load, and the voltage at the sense node 1 is amplified by three stage inverters 2, 5 and 6. A current path across input and output terminals of the inverter 2 is rendered electrically conductive by a pMOS transistor 3 and an nMOS transistor 4 which together precharge the sense node 1. An nMOS transistor 8 and an inverter 9 function to limit the bit line voltage and, when the input terminal voltage of the inverter 9 is shifted to higher than a threshold voltage, the nMOS transistor 8 is turned off. The bit line is connected to an input terminal of the inverter 9 by means of a Y-selecting transistor 10. To the bit line are connected MOS transistors 12, 13, . . . each constituting a memory cell. Selection signals $\phi X1$, $\phi X2$, . . . are supplied to the MOS transistors 12, 13, . . . , respectively, while a selection signal $\phi Y$ is supplied to the Y-selecting transistor 10. The number of the Y-selecting transistors and the number of the MOS transistors constituting the memory cells are determined in dependence upon the size of the memory cell array, although only a few of these MOS transistors are shown for simplicity. A MOS transistor 11 is a precharging transistor which, when turned on, precharges the bit line.

The readout operation of the EPROM is effectuated by amplification by the inverters 2, 5 and 6. High-speed sensing becomes possible because the electrical potential at the sense node 1 already differs at the precharging stage as a function of data stored in the memory cell. Turning to FIGS. 2 and 3 showing voltage changes at the sense node 1, FIG. 2 shows voltage changes when a directly preceding data is in the erasure state and FIG. 3 shows voltage charges when a directly preceding data is in the program or write state. If, as shown in FIG. 2, the directly preceding data is in the erased state, and the current cell or the accessed cell is the programmed cell, the voltage changes describe a curve $R_1$. If the current cell is in the erased state, the voltage changes describe a curve $R_2$. If, as shown in FIG. 3, the previously stored contents are in the programmed state, and the current cell is in the programmed state, the voltage changes describe a curve $R_3$ and, if the current cell is in the erased state, the voltage changes describe a curve $R_4$. As shown in FIGS. 2 and 3, the time until time point $T_1$ is the precharging period, for the present EPROM, such that, during the time until the time point $T_1$, when the MOS transistors 3 and 4 are turned on and the input and the output of the inverter 2 are shorted, a sufficient voltage difference cannot be developed. However, during the precharging period, a voltage difference $\Delta Vm$, which is a function of the data in the MOS transistor to be accessed, already appears at the sense node. This voltage difference $\Delta Vm$ is produced in dependence upon the relative magnitude of a current $I_L$ flowing in the pMOS transistor 7 as a load and a current current $I_{CELL}$ flowing through the MOS transistors 12, 13 . . . as memory cells. Since the voltage difference $\Delta Vm$ is already produced at the precharging time point as a function of the data stored in the memory cells, high-speed sensing may be realized with the present EPROM.

However, the following problems are raised with the circuit shown in FIG. 1.

Taking the case in which, as an example, the source voltage Vcc is fluctuated from 5.5 V to 4.5 V. If the source voltage is 5.5 V and the cell accessed at a directly preceding time is in the programmed state, the bit line voltage is equal to a precharging voltage, such as 1.3 V, conforming to 5.5 V, which precharging voltage is higher than a precharging voltage, such as 1.15 V, conforming to 4.5 V. If the source voltage is changed to the lower value of 4.5 V, the bit line is in the overcharged state. Due to the bit line overcharging, the nMOS transistor 8 controlled by the inverter 9 is turned off, as a result of which the voltage at the sense node 1 is maintained at the higher value.

FIG. 4 shows the voltage at the sense node 1 during bit line overcharging. In case of overcharging, discharging occurs almost exclusively through the memory cell. Thus the bit line is kept in the overcharged state, so that, during a time interval $T_{EX}$, the nMOS transistor 8 is kept in the off state. With the cell current of 70 $\mu$A, a bit line capacity of 8 pF and an equilibrium bit line voltage difference of 0.15 V, as an example, the delayed time interval $T_{EX}$ caused by excess bit line charging is of the order of 17 ns. After time interval $T_{EX}$, the voltage at the sense node 1 proceeds as shown by a curve $R_4$ in FIG. 3. The operation of the inverters 2, 5 and 6 is started at time $T_1$. It is after lapse of the time $T_{SO}$ following the time interval $T_{EX}$ that data are ultimately read out from the sense amplifier. The reason is that, because of the limited driving capability of the inverters 2, 5 and 6 during the period until time point $T_1$, it takes a lot of time before the sense node output, which has been kept at a lower level conforming to the high sense node level during the time interval $T_{EX}$, is increased to an output level conforming to the sense node level at time point $T_1$. Thus the circuit of FIG. 1 has a defect that the readout time is prolonged as a result of bit line overcharging.

On the other hand, the circuit shown in FIG. 1 is affected by noise superposition. That is, if noise is superposed at the sense node 1, as shown in FIG. 5 the inverter 2 responds quickly at a peak $P_1$ so that the output voltage of the inverter 2 is lowered considerably. Since the driving capability of the inverter 2 itself remains low after peak $P_2$, the output voltage of the inverter 2 is returned to its original value only with a time lag.

Summary of the Invention

It is an object of the present invention to provide a semiconductor memory device in which readout time is not prolonged even on occurrence of a source voltage and bit line overcharging.

It is another object of the present invention to provide a semiconductor memory device in which stable amplification is assured even on noise superposition at the sense node.

The semiconductor memory device of the present invention includes plural stage amplifier means connected to a sense node connected in turn to a load, a bit line connected to a number of memory cells, and voltage limiting means between the bit line and the sense node. Switching means are connected across input and output terminals of each stage amplifier. During data readout, the switching means are actuated so that the plural stage amplifier means are set to the amplifying state from the sense node side amplifier on. In this manner, even in case of bit line overcharging, high-speed data readout is assured, without the output level being shifted markedly towards an erroneous logic level side. Since the amplifiers remote from the sense node are transiently in the non-amplifying state, stable amplification is assured. In a preferred embodiment of the present invention, precharging means and discharging means are provided in the bit line and electrical discharging occurs before or simultaneously with precharging. The electrical charges resulting from bit line overcharging may be drained by the operation of the discharging means to lower noise components.

Precharging means may also be provided at the sense node.

BRIEF DESCRIPTION OF THE DRAWINGS

FIGS. 7a to 7d are waveform diagrams showing the operation of the device of FIG. 6, wherein FIG. 7a shows the timing of a signal $\phi SW1$; FIG. 7b the timing of a signal $\phi SW2$; FIG. 7c shows a sense node voltage and a sense amplifier output by a solid line and a broken line, respectively, on occurrence of bit line overcharging; and FIG. 7d shows a sense node output voltage and a sense amplifier output voltage by a solid line and a broken line, respectively, on occurrence of noise superposition.

First Embodiment

Figure 6:
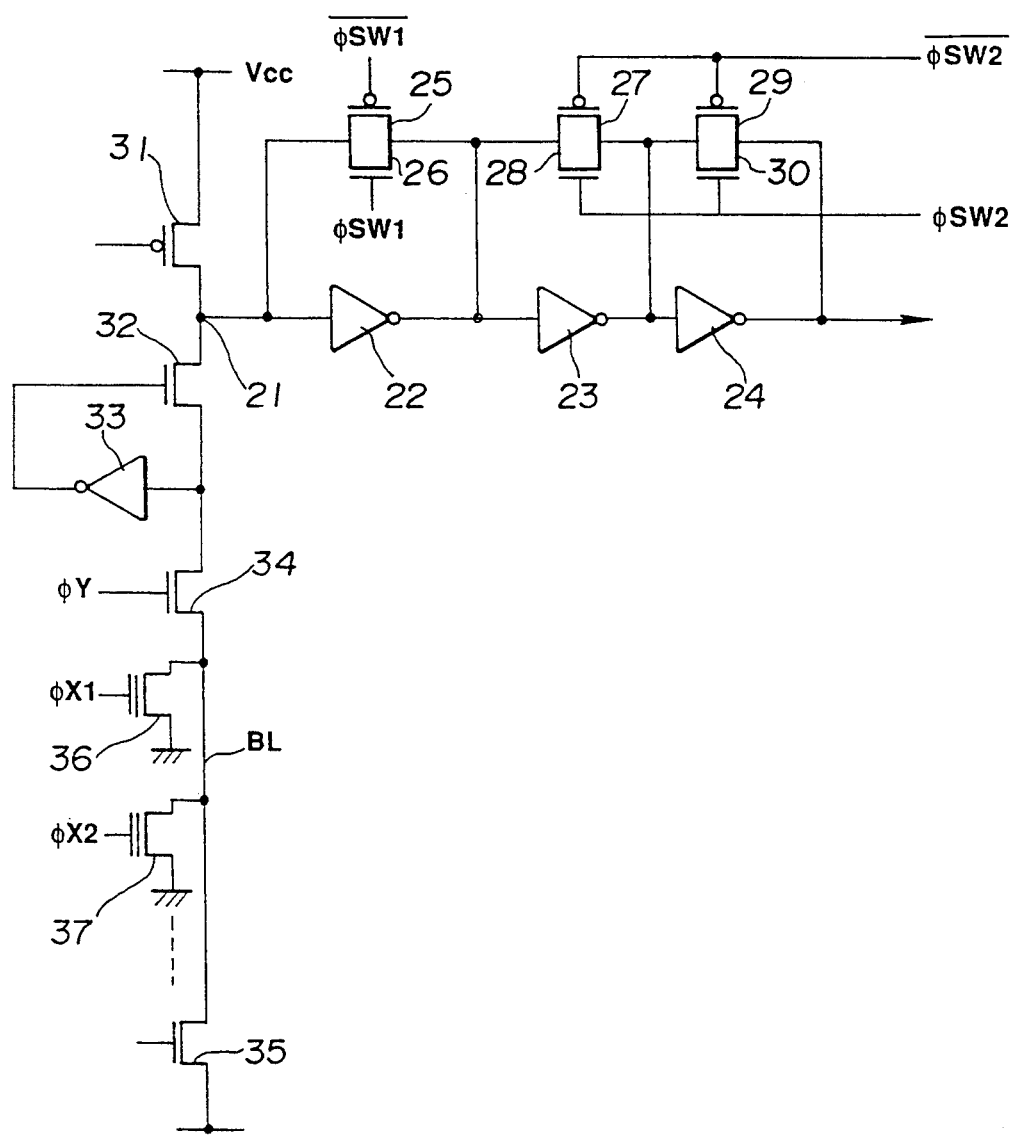
FIG. 6 is a circuit diagram showing essential portions of an embodiment of a semiconductor memory device having a current-to-voltage conversion type sense amplifier according to the present invention.

The present embodiment is directed to an example of an EPROM having a circuit configuration shown in FIG. 6.

Turning first to the circuit configuration, amplifier means thereof is constituted by series connected three stage inverters 22, 23 and 24. The first stage inverter 22 has its input terminal connected to a sense node 21. The three-stage inverters 22, 23 and 24 represent current-to-voltage conversion type amplifiers for converting the current through the sense node 21 into a voltage and outputting the resulting voltage. A pMOS transistor 25 and an nMOS transistor 26, functioning as switching means, are connected in parallel across an input terminal and an output terminal of the first stage inverter 22. One of the source and the drain of each of the pMOS transistors 25 and the nMOS transistor 26 is connected to the input terminal of the inverter 22, whereas the other of the source and the drain of each of the pMOS transistor 25 and the nMOS transistor 26 is connected to the output terminal of the inverter 22. A control signal $\phi SW1$ is supplied to the gate of pMOS transistor 25 and a control signal $\phi SW1$ is supplied to the gate of the nMOS transistor 26. The control signal $\phi SW1$ has a logical level opposite to that of the control signal $\phi SW1$. Therefore, when the control signal $\phi SW1$ is at a logically high "H" level, a current path across the input and output terminals of the inverter 22 is rendered conductive via pMOS transistor 25 and nMOS transistor 26, whereas, when the control signal $\phi SW1$ is at a logically low or "L" level, the current path across the input and output terminals of the converter 22 is rendered electrically nonconductive, with the inverter 22 being in the amplifying state.

A pMOS transistor 27 and an nMOS transistor 28, functioning as switching means, are connected between input and output terminals of the next stage inverter 23. One of the source and the drain of the pMOS transistor 27 and one of the source and the drain of the nMOS transistor 28 are connected to an input terminal of the inverter 23, whereas the other of the source and the drain of the pMOS transistor 27 and the other of the source and the drain of the nMOS transistor 28 are connected to the output terminal of the inverter 23. Similarly, a pMOS transistor 29 and an nMOS transistor 30 as switching means are connected to the next stage inverter 24, in such a manner that one of the source and the drain of each of a pMOS transistor 29 and an nMOS transistor 30 is connected to an input terminal of the inverter 24 and the other of the source and the drain of the pMOS transistor 29 and the nMOS transistor 30 is connected to the output terminal of the inverter 24. To the gates of the pMOS transistors 27 and 29 and the nMOS transistors 28 and 30, functioning as switching means for these inverters 23 and 24, there are supplied a control signal $\phi SW2$ and a control signal $\phi SW2$, respectively. These control signals undergo transition with a certain delay with respect to the control signals φSW1 and φSW1, as will be explained subsequently. By providing such time difference, adverse effects of the noise may be prevented to assure positive amplification. On the other hand, by providing the switches interconnecting the input and output terminals of the second and third stage inverters 23 and 24, the output levels of the second and third inverters 23 and 24 are maintained in the vicinity of the threshold voltage prior to start of the amplification, so that a stable high speed operation may be assured despite fluctuations in the source voltage Vcc.

The sensing node 21 is a junction between a pMOS transistor 31 functioning as a load and an nMOS transistor 32 constituting a voltage limiting circuit. Data reading at the precharging stage becomes possible by the current flowing through the sense node. The voltage limiting circuit is made up of the transistor 32 and an inverter 33. The drain of the nMOS transistor 32 functions as the sense node 21, whereas the source of the nMOS transistor 32 is connected to the input terminal of the inverter 33, while being connected via a column selecting transistor 34 to a bit line BL. The output terminal of the inverter 33 is connected to the gate of the nMOS transistor 32. When the source voltage of the nMOS transistor 32 is lower than the threshold voltage of the inverter 33, the output voltage of the inverter 33 goes high to turn on the nMOS transistor 32 to enable discharging of the sense node 21. Conversely, when the source voltage of the nMOS transistor 32 is higher than the threshold voltage of the inverter 33, the output voltage of the inverter 33 is at a low level to turn off the nMOS transistor 32.

The selecting transistor 34 is a MOS transistor for selecting one of the columns of a memory cell array. Although only one of the transistors 34 is shown, a plurality of selecting transistors 34 are provided as a function of the number of the columns. A column selecting signal φY is supplied to the gate of the selecting transistor 34. A number of MOS transistors 36, 37, . . . , constituting memory cells, are connected to the bit line BL connected in turn to the selecting transistor 34. Each of the MOS transistors 36, 37, . . . is provided with a control gate, besides a floating gate, and row selecting signals φX1, φX2, . . . are supplied to these control gates. A ground voltage is supplied to the sources of the MOS transistors 36, 37, . . . . A precharging MOS transistor 35 is connected to the terminal end of the bit line BL. During the precharging period following transistor of the address signal, the MOS transistor 35 is turned on to precharge the bit line BL.

In the operation of the above described EPROM of the present embodiment, if, after precharging of the bit line BL, under usual operating states, the selected MOS transistor is in the program or write state, the current scarcely flows through the bit line BL, and the current flowing through pMOS transistor 31 as a load flows through the pMOS transistors 25, 27 and 29 and the nMOS transistors 26, 28 and 30 functioning as switching means, and also through the nMOS transistors of the inverters 22, 23 and 24 and thence to ground. In this state, the voltage at the sense node 21 is not lower than the threshold voltage of the inverter 22. The output level of the inverter 22 then becomes slightly lower, when the control signal φSW1 is at the "H" level and the inverter 22 is in the amplifying state. The control signal φSW2 then goes high to turn off the MOS transistor 27 to 30, with the inverters 23 and 24 being in the amplifying state. The output of the inverter 22 is now set free from the state in which it is suppressed in amplitude by the MOS transistors 27 to 30 and the inverters 23 and 24, and is rapidly shifted to a low level associated with the high level of the sense node 21. The result is that the input voltage to the inverter 23 and hence the output voltage of the inverter 24 are rapidly lowered to sense data.

On the other hand, if, under usual operating states as above, the MOS transistor of the selected memory cell is in the state of erasure, the current flowing through the bit line BL becomes higher than that flowing through pMOS transistor 32, and the current which is in shortage flows from the source voltage Vcc of the inverter 32 through the pMOS transistor 31, pMOS transistor 25 and nMOS transistor 26 to the sense node 21 and bit line BL. As a result, the potential at the sense node 21 becomes lower than the threshold voltage of the inverter 22. High-speed data sensing is realized by step-by-step amplification at the first stage inverter 22 and the following second and third stage inverters 23 and 24.

Figure 7:
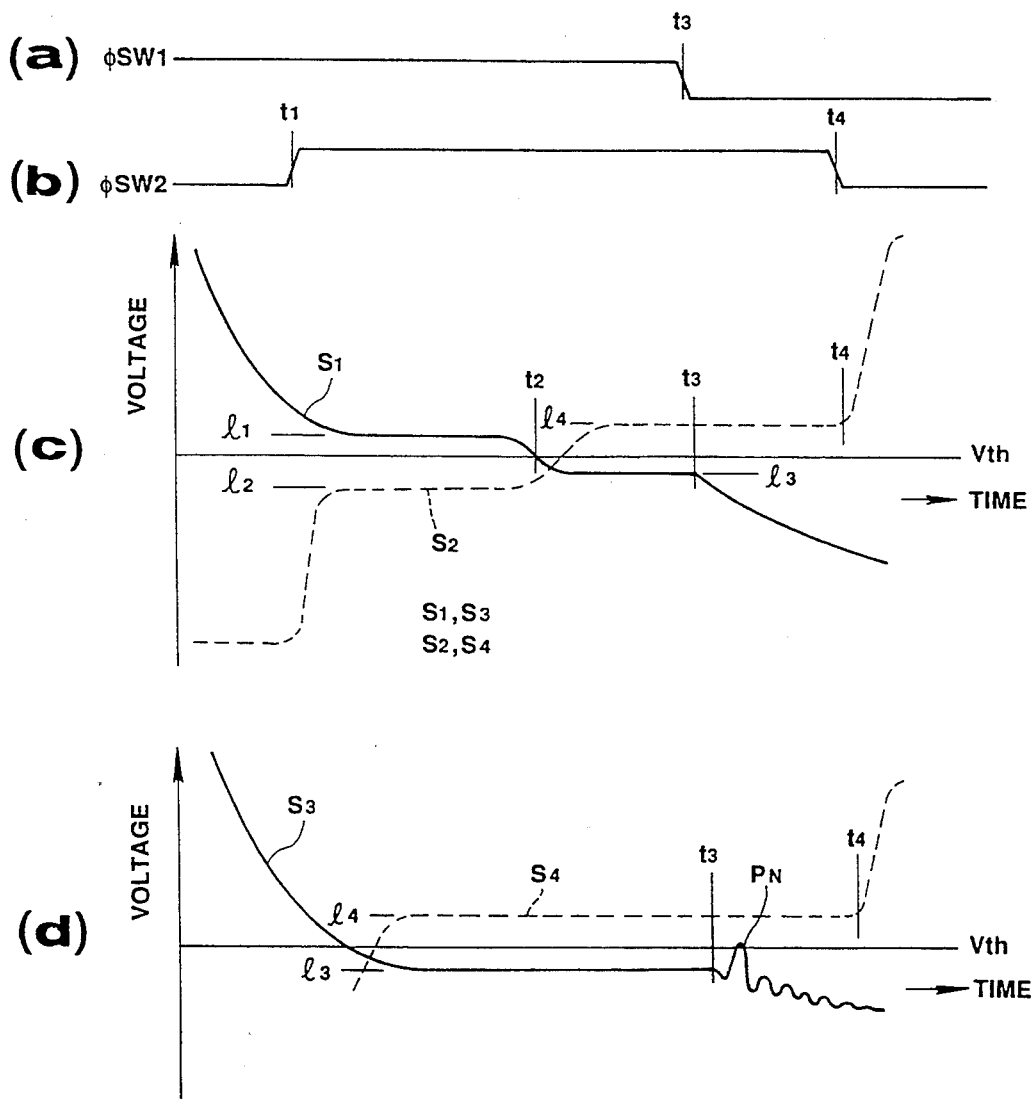

Referring to FIGS. 7a to 7c, the operation when the source voltage Vcc is changed to produce overcharging of the bit line is hereinafter explained. Although the bit line is in the overcharged state if the source voltage Vcc is changed, as described previously, high speed reading is still possible with the present EPROM.

It is assumed that the preceding memory cell is in the program state and the source voltage is changed from 5.5 V to 4.5 V. If a memory cell being accessed is in the state of erasure, the level of the sense node, shown by a curve S1 in FIG. 7, which should shift promptly to a level in the vicinity of and lower than the threshold voltage Vth of the inverter 22, cease to be shifted at a level $l_1$ slightly higher than the threshold voltage Vth. That is, as explained previously, there would be no inconvenience if, when the source voltage Vcc is changed from 5.5 V to 4.5 V, the voltage level of the bit line BL be lowered correspondingly. However, since electrical charges corresponding to the voltage of 5.5 V are left on the bit line BL, the nMOS transistor 34 of the voltage limiting circuit is turned off, so that shifting of the sense node voltage level ceases at $l_1$ and hence the bit line BL is in the overcharged state.

However, in the present embodiment the control signal φSW1 shown in FIG. 7a goes high before level transition at the sense node 21 occurs during reading, at the same time that the control signal φSW1 goes low. Thus the input and the output terminals of the inverter 22 are electrically connected to each other via pMOS transistor 25 and nMOS transistor 26. This causes voltage level transition to be started at the sense node 21. At time $t_1$ control signal φSW2 is changed from "H" level to "L" level, whereas control signal φSW2 is changed from "L" level to "H" level, so that the pMOS transistors 27 and 29 and the nMOS transistors 28 and 30 are turned on, while the inverters 23 and 24 are in a non-amplifying state. The time $t_1$ may be concurrent with or slightly retarded with respect to the timing when the control signal φSW1 shifts from "L" level to "H" level. With the inverters 23 and 24 in the non-amplifying state, the output voltage of the sense amplifier, shown by a broken line $S_2$ in FIG. 7c, is pulled up to a level $l_2$ in the vicinity of the threshold voltage Vth, in association with input level $l_1$ of the inverter 22. Thus there may occur no drastic level transition in the output voltage.

During the period when the voltage level at the sense node is at level $l_1$, excess charges on the overcharged bit line BL are drained in the form of a cell current. When the level on the bit line BL becomes lower than the threshold voltage Vth of the inverter 23 of the voltage limiting circuit, nMOS transistor 32 is turned on. The current flowing through the sense node 21 is no longer the current which flows from the pMOS transistor 31 as a load to the inverter 22 via switching means, but is the current which flows via nMOS transistor 32 to the memory cell. The result is that the level at the sense node 21 is pulled towards the ground voltage side, such that, at time $t_2$, the voltage level at the sense node 21 becomes lower than the threshold voltage Vth of the inverter 22, as shown by a curve $S_1$, and shifts from the level $l_1$ to a level 63, which is level proper to the sense node and which corresponds to the selected cell being in the erased state. With a slight delay from time $t_2$, the voltage at the output terminal of the inverter 24 is shifted, in accordance with the above changes in current, from the level $l_2$ to a level $l_4$ slightly higher than the threshold voltage Vth, although the inverter 24 is in the non-amplifying state. Since the pMOS transistors 27, 29 and the nMOS transistors 28, 30 are turned on and hence in the non-amplifying state, it is only possible for the electrical voltage level at the input and output terminals of the inverters 23 and 24 to assure the level in the vicinity of the threshold voltage Vth, as a result of which the sense amplifier may respond quickly to occasional changes in data in the course of precharging during reading.

Then, at time $t_3$, control signal lSW1 is changed from "H" level to "L" level. Thus the pMOS transistor 25 and the nMOS transistor 26, connected across the input and output terminals of the inverter 22, are both turned off. This terminates the precharging state at the sense node 21 and the voltage level at the sense node 21 is pulled down towards the ground level, as shown by curve $S_1$. Since the selected cell is in the state of erasure, the voltage level at the output terminal of the inverter 23 in the amplifying state is pulled up to a higher level. However, since the inverters 23 and 24 still remain in the non-amplifying state, with the pMOS transistors 27 and 29 and the nMOS transistors 28 and 30 being turned on, the impedance at the input terminal of the inverter 23 is also low, so that no definite voltage difference appears at the output terminal of the inverter 24.

Then, at a time $t_4$, delayed with respect to time $t_3$, control signal $\phi$SW2 is changed from the "H" level to the "L" level to turn off the pMOS transistors 27 and 29 and the nMOS transistors 28 and 30. This activates the inverters 23 and 24 from the non-amplifying state to the amplifying state, so that signals read out since time $t_4$ one quickly presented at the output terminal of the inverter 24. Since transition of the output voltage is only from near the level $l_4$ in the vicinity of the threshold voltage Vth, as shown by curve $S_2$, there occurs no level transition through a full range of amplitude as in the case of the conventional system shown by a broken line in FIG. 4. This enables high-speed data readout even at the time of overcharging of the bit line.

The operation for the case in which noise is superposed at the sense node is explained by referring to FIG. 7d. In the absence of the overcharging of the bit line BL, the curve $S_3$ indicating the sense node level quickly reaches the level $l_3$, as shown in FIG. 7d, while a curve $S_4$ indicating the output voltage of the sense amplifier quickly reaches the level $l_4$. These levels $l_3$ and $l_4$ in the vicinity of the threshold voltage Vth are assumed because the input and output terminals of each of the inverters 22, 23 and 24 are electrically connected to each other by the control signals $\phi$SW1 and $\leq$SW2.

If noise is superposed at the sense node 21 in this state, since the MOS transistors 25 to 30 are all turned on, the input impedance at the input terminals of the inverters 22, 23 and 24 is low, so that no output voltage responsive to noise appears at the output terminal. When the control signal $\phi$SW1 is changed at time $t_3$ from the "H" level to the "L" level to turn off the pMOS transistor 25 and the nMOS transistor 26, with the inverter 22 thus being in the amplifying state, at least the inverter 22 may respond to noise. However, the downstream side inverters 23 and 24 are as yet in the non-amplifying state and hence are not ready to amplify the output voltage of the inverter 22 which is responsive to noise. This means that no adverse effects of noise are reflected in the output since time $t_3$ until time $t_4$, so that stability with respect to noise is assured. That is, a noise $P_N$ superposed at the sense node 21 is not reflected in the output voltage as shown by a broken line $S_4$, as shown in FIG. 7d. Since time $t_4$, inverters 23 and 24 are in the amplifying state for producing the required output voltage.

With the above described EPROM of the present embodiment, since the pMOS transistors 27 and 29 and the nMOS transistors 28 and 30 as switching means are also provided for the inverters 23 and 24 for electrically interconnecting the input and the output terminals of the inverters 23 and 24, transition of the output voltage starts from the level which is close to the threshold voltage Vth. Therefore, even in case of an overcharging of the bit line BL, an output voltage may be produced within a sufficiently short time. Since the inverters 23 and 24 remote from the sense node are in the amplifying state with a time delay, stable amplification may be achieved even in case of noise superposition.

Second Embodiment

The present second embodiment of an EPROM is a modification of the previously described first embodiment and is so designed that the bit line undergoes electrical discharging.

Figure 8:
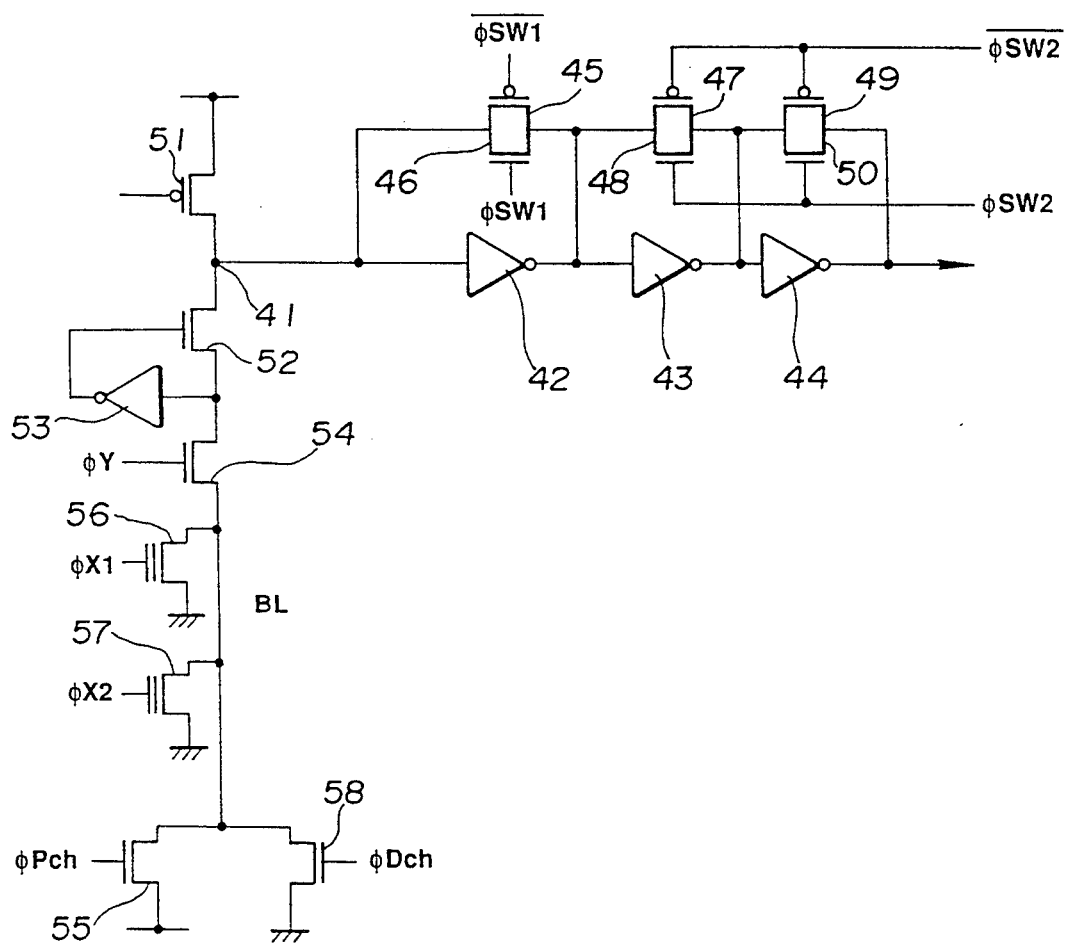
FIG. 8 is a circuit diagram showing essential portion of a modified embodiment of a semiconductor memory device having a current-to-voltage conversion type Sense amplifier according to the present invention.

The circuit configuration is shown in FIG. 8. The EPROM of the present embodiment includes amplifier means, comprised of series connected three stage inverters 42, 43 and 44, of which the first stage inverter 42 has its input terminal connected to a sense node 41. Switching means composed of a parallel connection of a pMOS transistor and an nMOS transistor is provided across an input terminal and an output terminal of each of the inverters 42, 43 and 44. Thus a set of a pMOS transistor 45 and an nMOS transistor 46 is associated with the first stage inverter 42, a set of a pMOS transistor 47 and an nMOS transistor 48 is assorted with the second stage inverter 43 and a set of a pMOS transistor 49 and an nMOS transistor 50 is associated with the third stage inverter 44. A control signal $\phi$SW1 is coupled to the nMOS transistor 46 and a control signal $\overline{\phi SW1}$ complementary to the control signal $\phi$SW1 is coupled to the pMOS transistor 45. A control signal $\phi$SW2 is coupled to the nMOS transistors 48 and 50, and a control signal $\overline{\phi SW2}$, having a logical level opposite to that of the control signal $\phi$SW2, is coupled to the pMOS transistors 47 and 49. It is noted that the control signal $\phi$SW2 undergoes transition with a slight delay with respect to the control signal $\phi$SW1, as in the first embodiment. By providing much time difference, adverse effects of the noise may be eliminated. Also, since switching means are provided in the second and third stage inverters 43 and 44 for electrically connecting the input and output terminals of the inverters 43 and 44, the output levels of the downstream side inverters 43 and 44 before the inverters are in the amplifying state may be maintained at the levels in the vicinity of the threshold voltage. Thus a stable high-speed readout operation may be assured despite fluctuations in the source voltage Vcc.

The sense node 41 is a junction between a pMOS transistor 51 functioning as a load and an nMOS transistor 52. Data readout at the precharging stage becomes possible as a function of the current flowing through the sense node 41. A voltage limiting circuit is made up of the nMOS transistor 52 and an inverter 53. As in the preceding embodiment, the drain of the nMOS transistor 52 is the sense node, while the source of the nMOS transistor 52 is connected to the input terminal of the inverter 53, while being connected to the bit, line BL via a column selecting transistor 54. The output terminal of the inverter 53 is connected to the gate of the nMOS transistor 52. When the source voltage of the nMOS transistor 52 is higher than the threshold voltage of the inverter 53, the output voltage of the inverter 53 is at a low level to turn off the nMOS transistor 52.

A selecting transistor 54 is a MOS transistor for selecting one of the columns of a memory cell array. Although only one of the transistors 54 in shown, a plurality of selecting transistors 54 are provided as a function of the number of the columns. A column selecting signal $\phi Y$ is supplied to the gate of the selecting transistor 54. A number of MOS transistors 56, 57, constituting memory cells, are connected to the bit line BL connected to the selecting transistor 54. Each of the MOS transistors 56, 57, ... is provided with a control gate, besides a floating gate, and row selecting signals $\phi X1$, $\phi X2$, ... are supplied to these control gates. A precharging MOS transistor 55 is connected to the terminal end of the bit line BL to which the MOS transistors 56, 57, ... are connected. During the precharging period following transition of the address signal, the MOS transistor 55 is responsive to a control signal $\phi Pch$ for precharging the bit line BL.

In the present EPROM, an nMOS transistor 58 as electrical discharging means is connected to the bit line BL. That is, the nMOS transistor 58 has its drain and source connected to the line BL and to a grounding line, respectively. A control signal $\phi Dch$ is supplied to the gate of the nMOS transistor 58. Thus, when the control signal $\phi Dch$ is at a high "H" level, electrical charges on the bit line BL may be discharged to the grounding line.

The above described EPROM of the present embodiment operates similarly to the previously described first embodiment, such that input and output terminal of the inverters 43 and 44 are electrically connected to each other by the pMOS transistors 47 and 49 and by the nMOS transistors 48 and 50 functioning as switching means. Since the output voltage transition occurs in this manner at the voltage level in the vicinity of the threshold voltage Vth, high speed readout may be assured even when an overcharging should occur in the bit line. Also, since the inverters 43 and 44 remote from the same node 41 are in the amplifying state with a time delay, stable amplification may be assured even if noise should be superposed at the sense node.

Figure 1:
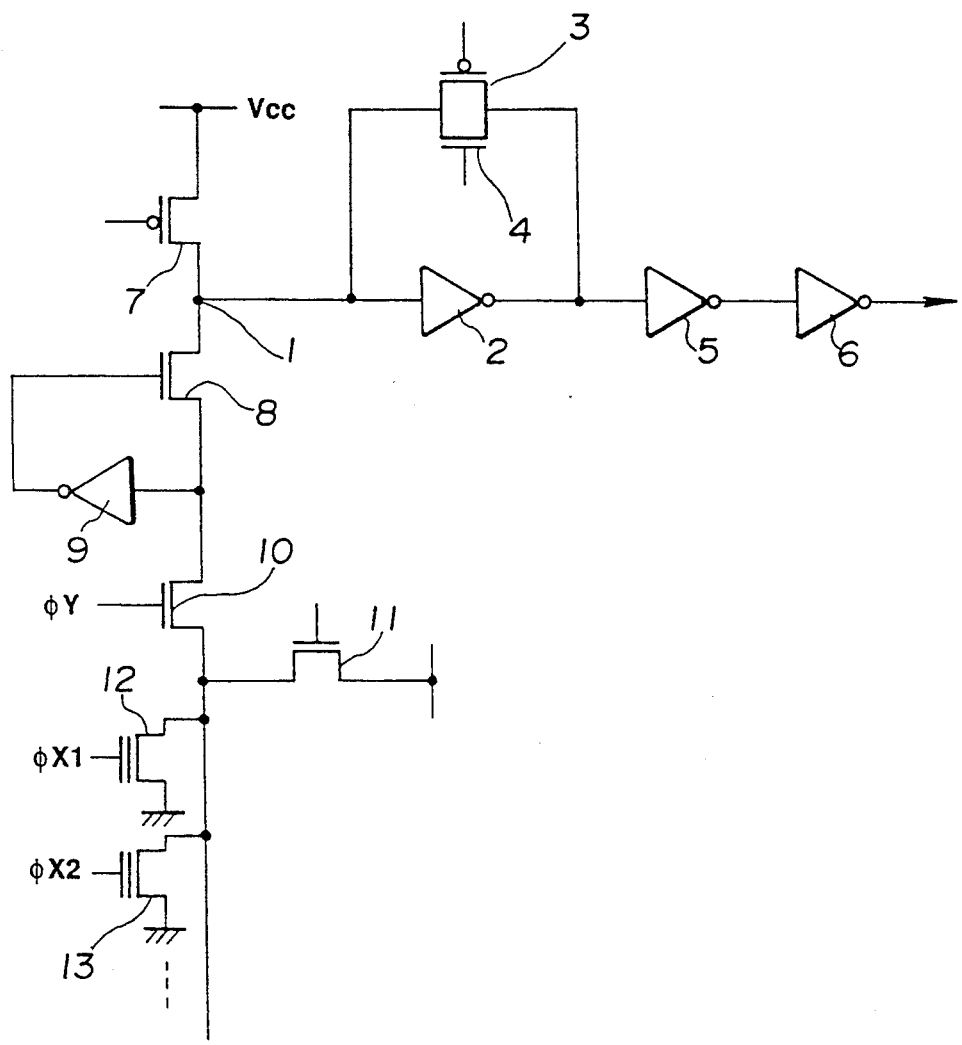
FIG. 1 is a circuit diagram showing essential portions of a typical conventional semiconductor memory device having a current-to-voltage conversion type sense amplifier.
Figure 2:
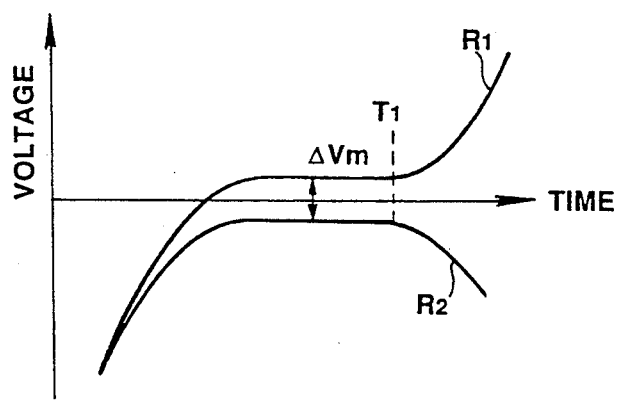
FIG. 2 is a graph showing voltage changes at the sense node when directly preceding data in the conventional device shown in FIG. 1 is in the erased state.
Figure 3:
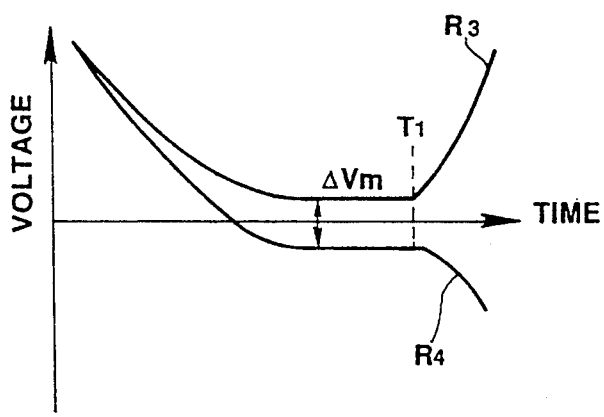
FIG. 3 is a graph showing voltage changes at the sense node when directly preceding data in the conventional device shown in FIG. 1 is in the programmed state.
Figure 4:
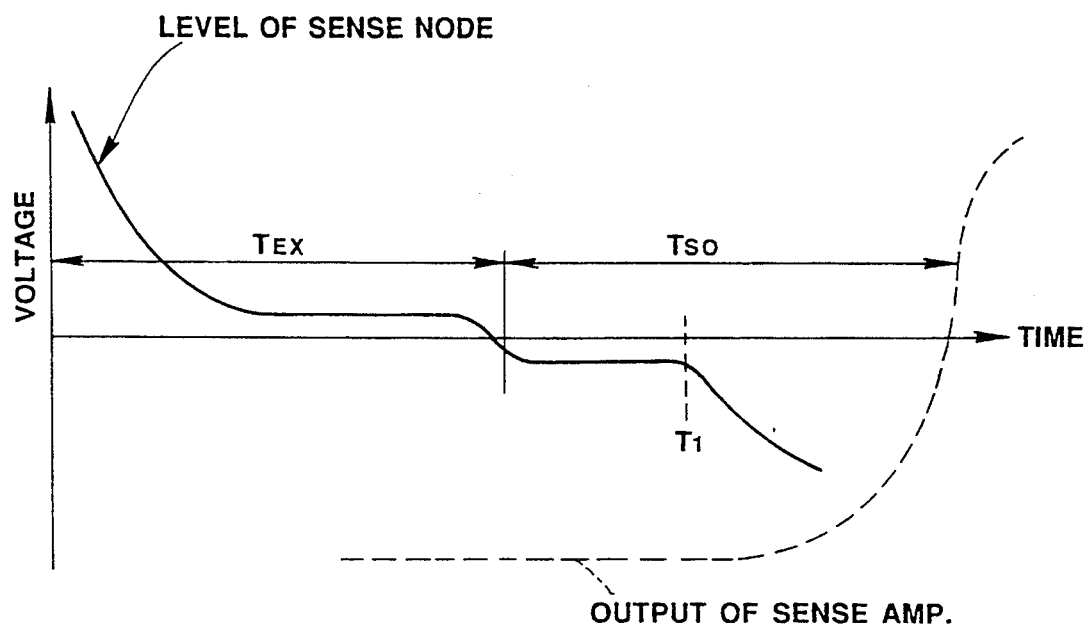
FIG. 4 is a graph showing voltage changes when bit line overcharging occurs in the conventional device shown in FIG. 1, wherein a solid line indicates a voltage level at the sense node and a broken line a sense amplifier output.
Figure 5:
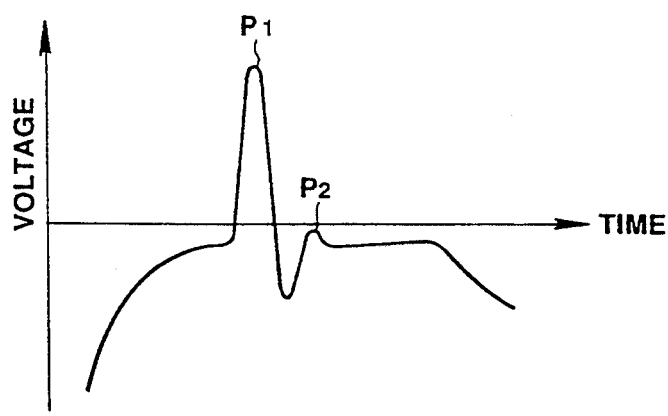
FIG. 5 is a graph showing voltage level changes when a noise is superposed at the sense node in the conventional device shown in FIG. 1.

In addition, with the present EPROM, electrical discharging is taken charge of by the nMOS transistor 58 for reducing the time interval corresponding to the time interval $T_{EX}$ in FIG. 4 significantly.

Figure 9:
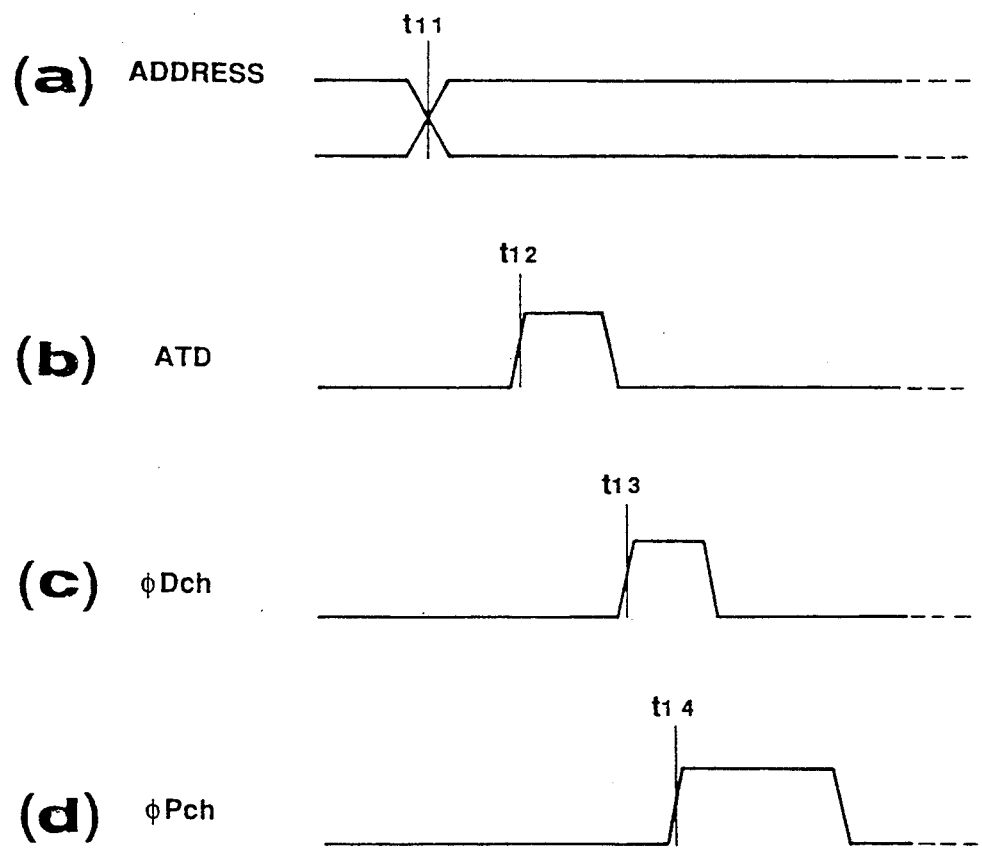
FIG. 9 is a timing chart showing the timing of various signals produced in the device shown in FIG. 8.

That is, with the present EPROM, after transition of an address signal occurs at time $t_{11}$, the shown in FIG. 9a, such transition is detected, and a pulse of an address transition detection (ATD) signal is generated at time $t_{12}$, as shown in FIG. 9b, by an ATD circuit, not shown. A pulse of a precharge control signal $\phi Pch$ is generated at time $t_{14}$ in association with the ATD pulse. However, at time $t_{13}$ preceding the time $t_{12}$, a pulse of a discharge control signal $\phi Dch$ is generated. The pulse of the control signal $\phi Dch$ turns on the nMOS transistor 58 during the time when the pulse is not the "H" level. With the nMOS transistor 58 being turned on a this manner, excess charges on the bit line BL are drained into the grounding line to prevent readout delay otherwise caused by the overcharging of the bit line BL. A voltage level of an order of 0.1 to 0.3 V relative to fluctuations in the source voltage Vcc of an order of 1 V suffices as a discharging voltage level of the bit line BL by the nMOS transistor 58. In this manner, transition of the voltage at the sense node 41 to a suitable level may occur within about 5 ns to shorten the time period corresponding to the time period $T_{EX}$ shown in FIG. 4 significantly.

Third Embodiment

The present third embodiment is a further modification of the EPROM of the preceding first embodiment, wherein according to the present third embodiment a precharging MOS transistor is provided at the sense node.

Figure 10:
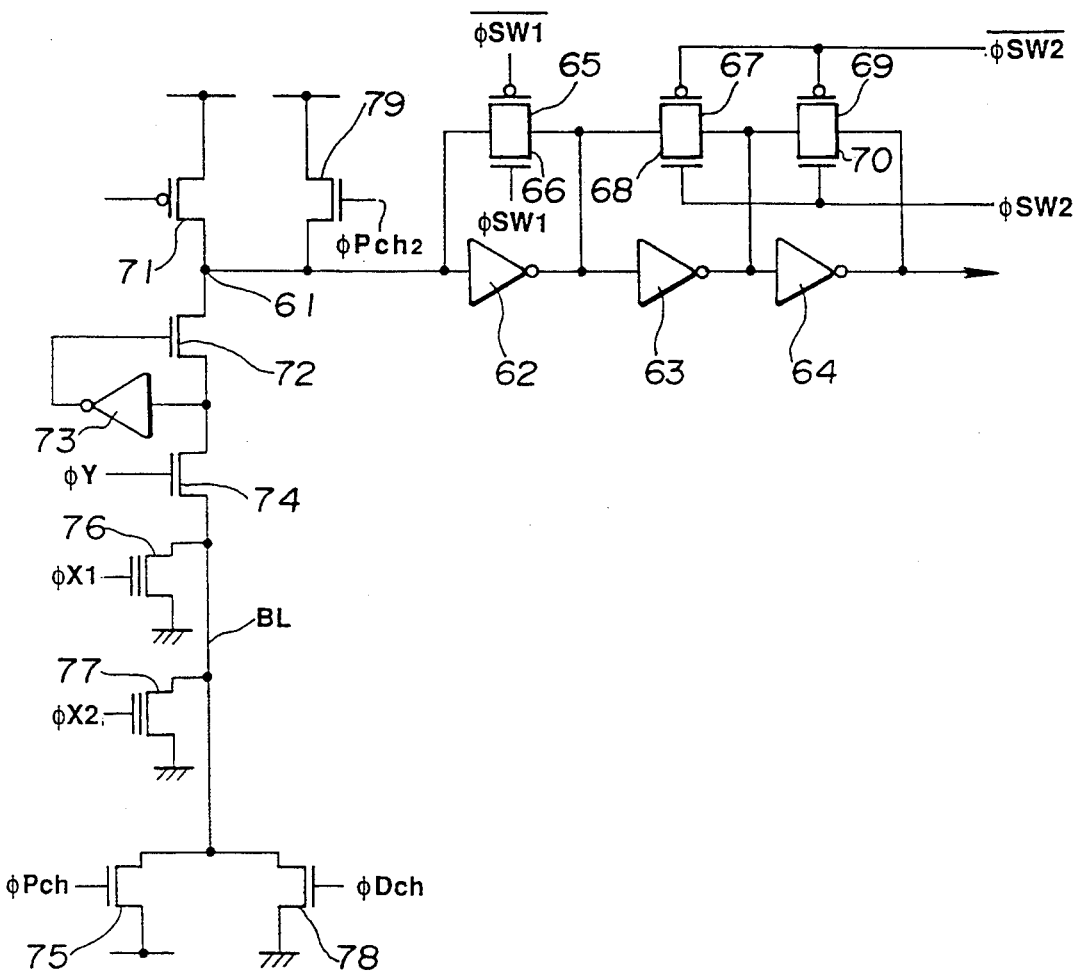
FIG. 10 is a circuit diagram showing essential portions of another modified embodiment of a semiconductor memory device having a current-to-voltage conversion type sense amplifier according to the present invention.

FIG. 10 shows a circuit configuration of the EPROM of the present embodiment, wherein amplifier means is comprised of series connected three-stage inverters 62, 63 and 64, of which the first stage inverter 62 has its input terminal connected to a sense node 61. Switching means composed of a parallel connection of a pMOS transistor and an nMOS transistor is provided across an input terminal and an output terminal of each of the inverters 62, 63 and 64. Thus a set of a pMOS transistor 65 and an nMOS transistor 66 is associated with the first stage inverter 62, a set of a pMOS transistor 67 and an nMOS transistor 68 is associated with the second stage inverter 63 and a set of a pMOS transistor 69 and an nMOS transistor 90 is associated with the third stage inverter 64. A control signal $\phi SW1$ is coupled to the nMOS transistor 66 and a control signal $\phi SW1$ having an opposite logical level to the control signal $\phi SW1$ is coupled to the pMOS transistor 65. A control signal $\phi SW2$ is coupled to the nMOS transistors 68 and 70, and a control signal $\phi SW2$, having a logical level opposite to the control signal $\phi SW2$, is coupled to the pMOS transistors 67 and 69. It is noted that the control signal $\phi SW2$ undergoes transition with a slight time delay with respect to the control signal $\phi SW1$, as in the first embodiment. By providing such time difference, adverse effects of the noise may be eliminated. Also, since switching means are provided in the second and third stage inverters 63 and 64 for electrically connecting the input and output terminals of the inverters 63 and 64, the output levels of the downstream side inverters 63 and 64 before the inverters are in the amplifying state may be maintained at voltage levels in the vicinity of the threshold voltage. Thus a stable high-speed readout operation may be assured despite fluctuations in the source voltage Vcc.

The sense node 61 is a junction between a pMOS transistor 71 as a load and an nMOS transistor 72. Data readout at the precharging stage becomes possible responsive to the current flowing through the sense node 61. In the present EPROM, a precharging MOS transistor 79 is provided at the sense node 61. The MOS transistor 79 has its source connected to the sense node 61 and its drain connected to the source voltage Vcc. A precharging signal $\phi Pch_2$ is supplied to the gate of the MOS transistor 79. The precharging signal $\phi Pch_2$ goes high at a time preceding or concurrent with the control signal $\phi SW1$ for precharging the bit line and the sense node 61 through the sense node 61 and transistors 72 and 74.

The voltage limiting circuit is made up of the transistor 72 and an inverter 73. As in the first embodiment, the drain of the nMOS transistor 72 functions as the sense node 61, whereas the source of the nMOS transistor 72 is connected to the input terminal of the inverter 73, while being connected via a column selecting transistor 74 to a bit line BL. The output terminal of the inverter 73 is connected to the gate of the nMOS transistor 72. When the source voltage of the nMOS transistor 72 is higher than the threshold voltage of the inverter 73, the output voltage of the inverter 73 is at a low level to turn off the nMOS transistor 72.

The selecting transistor 74 is a MOS transistor for selecting one of the columns of a memory cell array. Although only one of the transistors 34 is shown, a plurality of selecting transistors 74 are provided as a function of the number of the columns. A column selecting signal $\phi Y$ is supplied to the gate of the selecting transistor 74. A number of MOS transistors 76, 77, . . . , constituting memory cells, are connected to the bit line BL connected to the selecting transistor 74. Each of the MOS transistors 76, 77, . . . is provided with a control gate, in addition to a floating gate, and row selecting signals $\phi X1$, $\phi X2$, . . . are supplied to these control gates. A ground voltage is supplied to the sources of the MOS transistors 76, 77, . . . . A precharging MOS transistor 75 is connected to the terminal end of the bit line BL. During the precharging period following transition of the address signal, the MOS transistor 75 is responsive to a control signal $\phi Pch$ for precharging the bit line BL.

In the present EPROM, an nMOS transistor 78 as electrical discharging means is connected to the bit line BL. That is, the nMOS transistor 78 has one of its drain and source connected to the bit line BL and the other of its drain and source connected to ground. A control signal $\phi Dch$ is supplied to the gate of the nMOS transistor 78. Thus, when the control signal $\phi Dch$ is at a high "H" level, electrical charges on the bit line BL may be discharged to the grounding line.

With the EPROM of the present embodiment, similarly to the previously described first embodiment, the current paths across the input and output terminals of the inverters 63 and 64 are rendered conductive by the pMOS transistors 67 and 69 and the nMOS transistors 68 and 70. High speed readout may be provided because transition of the output voltage of each of the inverters occurs only from the level in the proximity of the threshold voltage Vth. On the other hand, since the inverters 63 and 64 remote from the sense node are in the amplifying state with a time delay, stable amplification may be assured even in case of noise superposition. In addition, with the present EPROM, since the bit line BL as far as the sense node 61 may be precharged more quickly with the aid of the MOS transistor 79 and 75, the voltage level at the sense node 61 is in the vicinity of the threshold voltage Vth since the output when the current path across the input and output terminals of each of the inverters 62 and 64 is rendered conductive by switching means, so that readout time may be reduced significantly. The problem involved in overcharging of the bit line BL is also eliminated by the MOS transistor 78 taking charge of the electrical discharging of the bit line BL.

What is claimed is:

1. A semiconductor memory device formed on a semiconductor substrate and enabling at least data stored in a memory cell to be read out, comprising
   a plurality of selectively accessible memory cells,
   a bit line connected to said memory cells,
   a sense node through which an electric current flows by means of a load,
   voltage limiting means connected between said sense node and said bit line, and
   a sense amplifier comprising multi-stage amplifier means connected to said sense node for converting the current flowing through said sense node into an electrical voltage and outputting said electrical voltage, each amplifier of said multi-stage amplifier means having switching means connected across input and output terminals thereof,
   said switching means being actuated during reading of said data from said memory cell for setting said amplifier means to amplifying states on the stage-by-stage basis from the amplifier closest to said sense node.

2. The semiconductor memory device according to claim 1 wherein a first control signal is supplied to said amplifier of the first stage and a second control signal is supplied to the amplifiers of the second and the following stages.

3. The semiconductor memory device according to claim 2 wherein said second control signal undergoes transition with a delay relative to said first control signal.

4. The semiconductor memory device according to claim 1 wherein said switching means comprises a parallel connection of a pMOS transistor and an nMOS transistor.

5. The semiconductor memory device according to claim 4 wherein a control signal and another control signal inverted from said control signal are supplied to said pMOS transistor and said nMOS transistor.

6. The semiconductor memory device according to claim 1 wherein said voltage limiting means comprises a MOS transistor controlled by a potential of said bit line.

7. The semiconductor memory device according to claim 6 wherein said MOS transistor is an nMOS transistor having its gate connected to an output terminal of an inverter, an input terminal of which is connected to said bit line, said nMOS transistor having one of its source and drain connected to said sense node and having the other of its source and drain connected to said bit line.

8. The semiconductor memory device according to claim 1 further comprising precharging means for precharging said bit line to a predetermined level before an amplifying operation of said amplifier means, and
   discharging means for electrically discharging said bit line at the time of or before an operation of said precharging means.

9. The semiconductor device according to claim 8 wherein said precharging means and said discharging means are constituted by MOS transistor means provided at a terminal end of said bit line.

10. The semiconductor device according to claim 1 further comprising precharging means for precharging said sense node to a predetermined level simultaneously with or before start of an amplifying operation of a first stage amplifier of said amplifier means.

11. The semiconductor device according to claim 10 wherein said precharging means comprises a MOS transistor.

* * * * *